United States Patent [19]

Otsuka

[11] Patent Number: 5,440,207

[45] Date of Patent: Aug. 8, 1995

[54] REFERENCE LIGHT SOURCE DEVICE USING LASER

[75] Inventor: Kazue Otsuka, Kawasaki, Japan

[73] Assignee: Fujitsu Limited, Kawasaki, Japan

[21] Appl. No.: 148,820

[22] Filed: Nov. 4, 1993

[30] Foreign Application Priority Data

Nov. 5, 1992 [JP] Japan .................................. 4-295544

[51] Int. Cl.$^6$ ......................................... H05B 37/02
[52] U.S. Cl. .................................... 315/149; 315/134; 315/151; 315/158; 315/156; 359/115; 372/22
[58] Field of Search .............. 315/149, 151, 134, 158, 315/156; 372/22; 359/115; 385/22

[56] References Cited

U.S. PATENT DOCUMENTS

| | | | |
|---|---|---|---|
| 4,856,011 | 8/1989 | Shimada et al. | 315/149 |
| 4,998,043 | 3/1991 | Unami et al. | |
| 5,249,193 | 9/1993 | Watanabe | 372/22 |
| 5,303,250 | 4/1994 | Masuda et al. | 372/22 |

Primary Examiner—Robert J. Pascal
Assistant Examiner—Reginald A. Ratliff

[57] ABSTRACT

A reference light source device includes a first laser diode emitting a reference light, a harmonic generating unit for generating an nth harmonic of the reference light, where n is an integer, a light generating unit for generating a light signal having a waveform equal to that of the nth harmonic of the reference light, and a photodetector for combining the nth harmonic and the light signal and for generating a first electric signal corresponding to a beat signal obtained by combining the nth harmonic and the light signal. Further, the source device includes a local signal generating unit for generating a local signal, a phase comparator for generating a control signal corresponding to a phase difference between the first electric signal and the local signal, and a driving unit for driving the first laser diode according to the control signal so that a frequency of the beat signal is equal to that of the local signal.

13 Claims, 4 Drawing Sheets

REFERENCE LIGHT SOURCE DEVICE USING LASER

BACKGROUND OF THE INVENTION

1. Field of the Invention

The present invention relates to a reference light source device using a laser diode.

2. Description of the Prior Art

Recently, light communications have widely been employed and the frequency band used in such light communications has become higher so as to enable transmission of an increased amount of information within the frequency band by means of frequency multiplexing.

A laser diode of the 1.5 μm range has been widely used for light communications in terms of the transmission characteristics of optical fibers. Recently, it has been strongly required that light signals are stable and are precisely regulated at desired frequencies in order to perform optical frequency division multiplexing or heterodyne detection to improve the sensitivity of light signal reception. As is well known, the oscillation frequencies of laser diodes are very sensitive to driving currents and temperature. Hence, it is necessary to precisely regulate the driving currents and the ambient temperature of laser diodes. Generally, the laser diodes deteriorate with age, and the oscillation frequencies thereof may vary. In order to maintain constant the frequencies of the laser diodes, in the long term, it is necessary to employ a reference for the light signals practically used.

SUMMARY OF THE INVENTION

It is an object of the present invention to provide a reference light source device capable of stably generating a light signal of a desired frequency for a long term.

This object of the present invention is achieved by a reference light source device comprising: a first laser diode emitting a reference light; harmonic generating means for generating an nth harmonic of the reference light where n is an integer; light generating means for generating a light signal having a waveform equal to that of the nth harmonic of the reference light; photodetector means for combining the nth harmonic and the light signal and for generating a first electric signal corresponding to a beat signal obtained by combining the nth harmonic and the light signal; local signal generating means for generating a local signal; phase comparator means for generating a control signal corresponding to a phase difference between the first electric signal and the local signal; and driving means for driving the first laser diode according to the control signal so that a frequency of the beat signal is equal to that of the local signal.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given of a related art of the present invention in order to facilitate understanding of the present invention.

Figure 1:
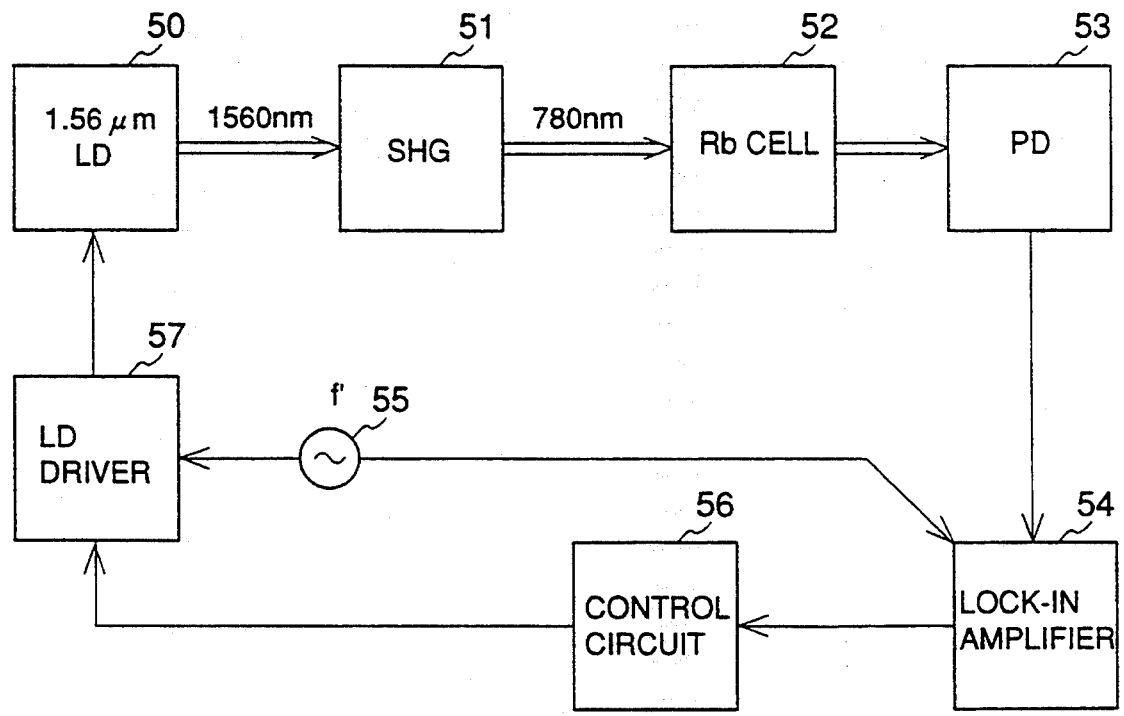
FIG. 1 is a block diagram of a reference light source device related to the present invention.

FIG. 1 is a block diagram of a related art of the present invention, and shows the structure of a reference light source device. As will be described in detail later, the reference light source device utilizes the light absorbing characteristics of the Rb (rubidium) atom in order to stabilize the oscillation frequency of the light.

The reference light source device shown in FIG. 1 is made up of a laser diode (LD) 50, a second-harmonic generator (SHG) 51, a Rb cell 52, a photodetector (PD) 53, a lock-in amplifier 54, an oscillator 55, a control circuit 56 and a laser diode driver 57. The laser diode 50 emits a reference light having a wavelength of 1.56 μm (1560 nm). The second-harmonic generator 51 generates the second harmonic of the 1.56 μm waveform. The Rb cell 52 absorbs a signal having a wavelength of 0.78 μm in accordance with the light absorbing characteristic of the Rb atom shown in FIG. 2. The photodetector 53 converts the light signal from the Rb cell 52 into an electric signal. The lock-in amplifier 54 carries out a synchronous detection. The oscillator 55 generates a frequency f' (equal to, for example, 1 kHz). The control circuit 56 carries out the PI control (Proportional and Integral control to control the driving current of the laser diode 50. The laser diode driver 57 generates the driving current controlled by the control circuit 56.

Generally, a laser diode oscillating the 1.56 μm range is used taking into account the transmission characteristics of optical fibers. The laser diode 50 oscillates in a state in which the output signal of the control circuit 56 and the frequency f' are superimposed on the driving current. The output light of the laser diode 50 is used for light communications, and is further applied to the second-harmonic generator 51. The second harmonic having the wavelength 0.78 μm is generated by the generator 51 and is applied to the Rb cell 52.

Figure 2:
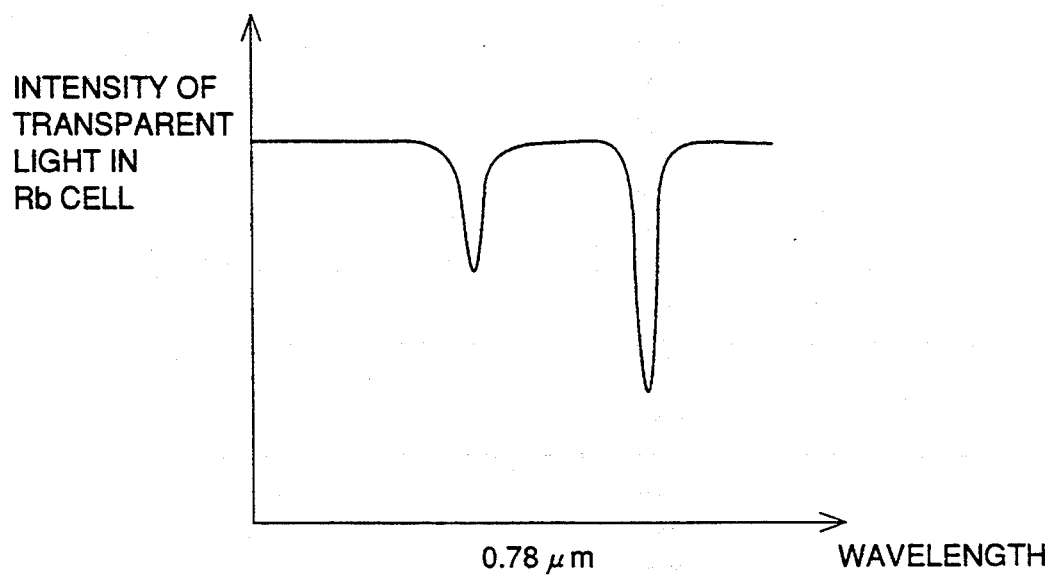
FIG. 2 is a graph of a light absorbing characteristic of the Rb atom.

As shown in FIG. 2, the Rb cell 52 absorbs the light of the wavelength 0.78 μm corresponding to the light absorbing wavelength (frequency) of the Rb atom. Hence, the light of the wavelength 0.78 μm contained in the second harmonic is absorbed by the Rb cell 52. The light signal, including frequency components other than the absorbing frequency of the Rb cell 52, is converted into the corresponding electric signal by the photodetector 53. The electric signal is then applied to the lock-in amplifier 54. It will be noted that the electric signal applied to the lock-in amplifier 54 contains the frequency component f'.

The lock-in amplifier 54 carries out the synchronous detection for the output signal of the photodetector 53 by using the frequency f' generated by the oscillator 55. The output signal of the lock-in amplifier 54, that is, the synchronous detection output signal indicates a value when the wavelength of the light output by the second-harmonic generator 51 deviates from the light absorbing wavelength of the Rb atom. Upon receipt of the synchronous detection output signal of the lock-in amplifier 54, the control circuit 56 generates the control signal based on the received synchronous detection output signal, and drives the laser diode driver 57. The control circuit 56 operates so that the control output becomes zero when the frequency of the second harmonic becomes equal to the light absorbing frequency of the Rb atom. Hence, it is possible to fix the wavelength of the light signal emitted by the laser diode 50 to be 1.56 μm.

However, in practice, the intensity of the second harmonic generated by the second-harmonic generator 51 is very weak. Hence, the detection sensitivity of the second-harmonic generator 51 is not high and the stability of the overall reference light source device is not good. Further, the light emitted by the laser diode 50 contains the frequency f' (modulation component). Furthermore, the device shown in FIG. 1 can lock the frequency of the light emitted by the laser diode 50 at only a frequency which is half of the light absorbing frequency of the Rb cell 52. Hence, it is possible to stably vary the frequency of the light. That is, the configuration shown in FIG. 1 is not used as a frequency-stabilized variable light source, which is applied to frequency division multiplexing in which the frequency is varied within the 1.56 μm range.

The specific object of the present invention is to eliminate the above problems of the related art.

Figure 3:
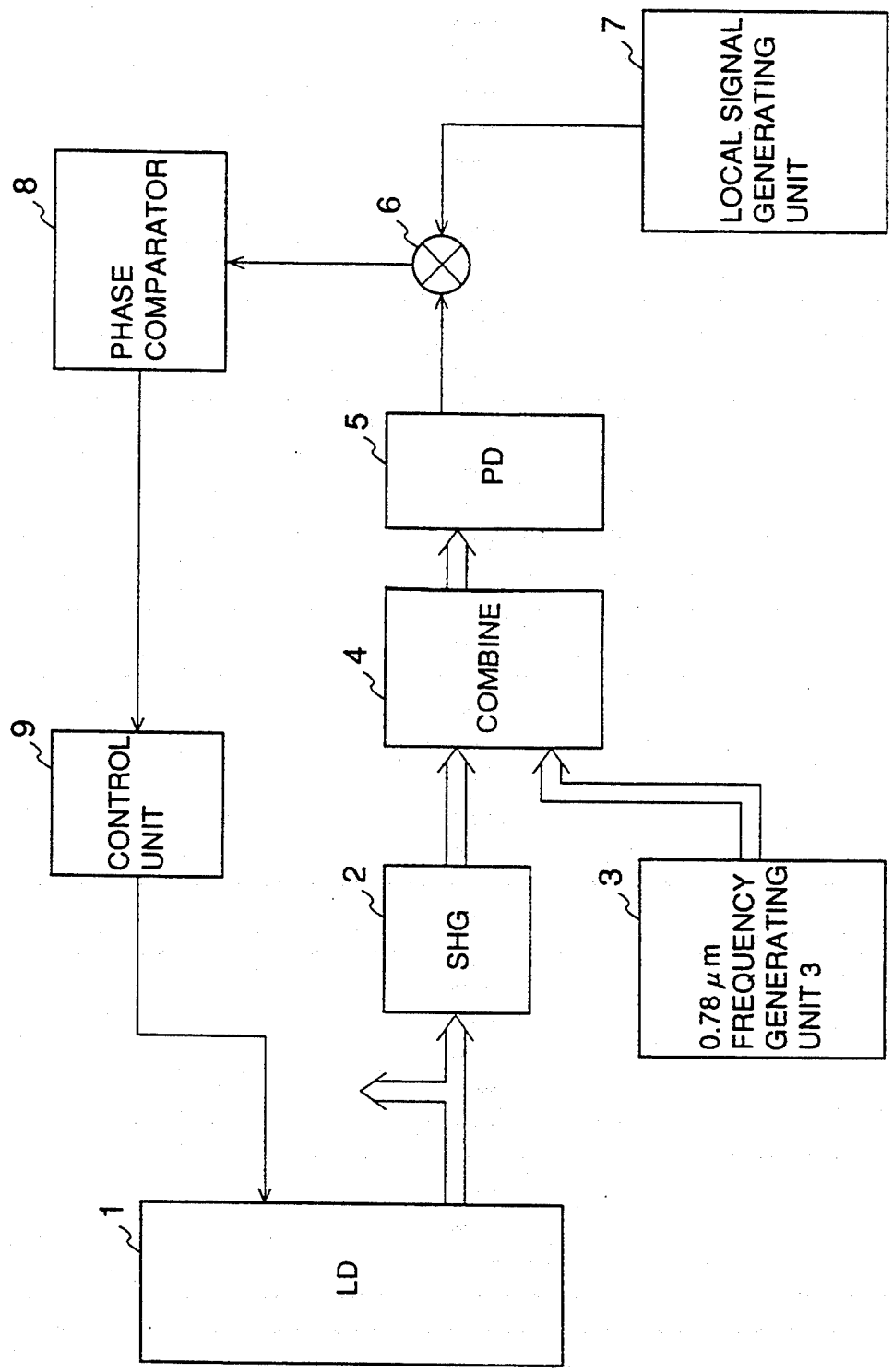
FIG. 3 is a block diagram of the principle of the present invention.

FIG. 3 is a block diagram of the principle of the present invention. The reference light source device shown in FIG. 3 includes a laser diode (LD) 1, a second-harmonic generator (SHG) 2, a frequency generator 3, a waveform combining unit 4, a photodetector (PD) 5, a multiplier unit 6, a local signal generator 7, a phase comparator 8, and a controller 9. The laser diode 1 emits a reference light of a waveform of, for example, 1.56 μm. The second-harmonic generator 2 corresponds to the second-harmonic generator 51 shown in FIG. 1. The frequency generator 3 generates a light signal locked at the frequency corresponding to the light absorbing wavelength of the Rb atom (0.78 μm). The waveform combining unit 4 combines the waveform from the second-harmonic generator 2 and the waveform from the frequency generator 3 with each other, and produces a combined waveform. The photodetector 5 converts the light having the combined waveform into an electric signal, which is applied to the multiplier unit 6. The local signal generator 7 generates a local signal having a fixed frequency. The local signal is, for example, a microwave signal. The multiplier 6 multiplies the electric signal from the photodetector 5 by the local signal from the local signal generator 7. The output signal of the multiplier unit 6 is applied to the phase comparator 8, which detects the phase difference between the output signal of the photodetector 5 and the local signal. A signal indicating the detected phase difference is applied to the controller 9, which controls the laser diode 9 so that the phase difference becomes zero.

More particularly, the reference light emitted by the laser diode 1 is used for light communications, and a part of the light is applied to the second-harmonic generator 2, which generates the second harmonic of the received light. The frequency generator 3 generates the light signal having a waveform of 0.78 μm corresponding to the light absorbing frequency of the Rb atom. The waveform combining unit 4 combines the two light signals and generates the combined waveform having a light heterodyne beat component of the two light signals. The combined light of the waveform combining unit 4 is converted into an electric signal, which signal is multiplied by the local signal generator 7. The output signal of the multiplier unit 6 is applied to the phase comparator 8, which detects the phase difference between the output signal of the photodetector 5 and the local signal generator 7. The controller 9 drives the laser diode 1 on the basis of the detected phase difference signal so that the beat signal frequency output by the photodetector 5 is fixed to be the stable frequency of the local signal generated by the local signal generator 7. Hence, the laser diode 1 is made to emit the reference light stabilized at the waveform 1.56 μm. By varying the frequency of the local signal generated by the local signal generator 7, it is possible to vary the frequency of the reference light within the drivable 1.56 μm range.

Figure 4:
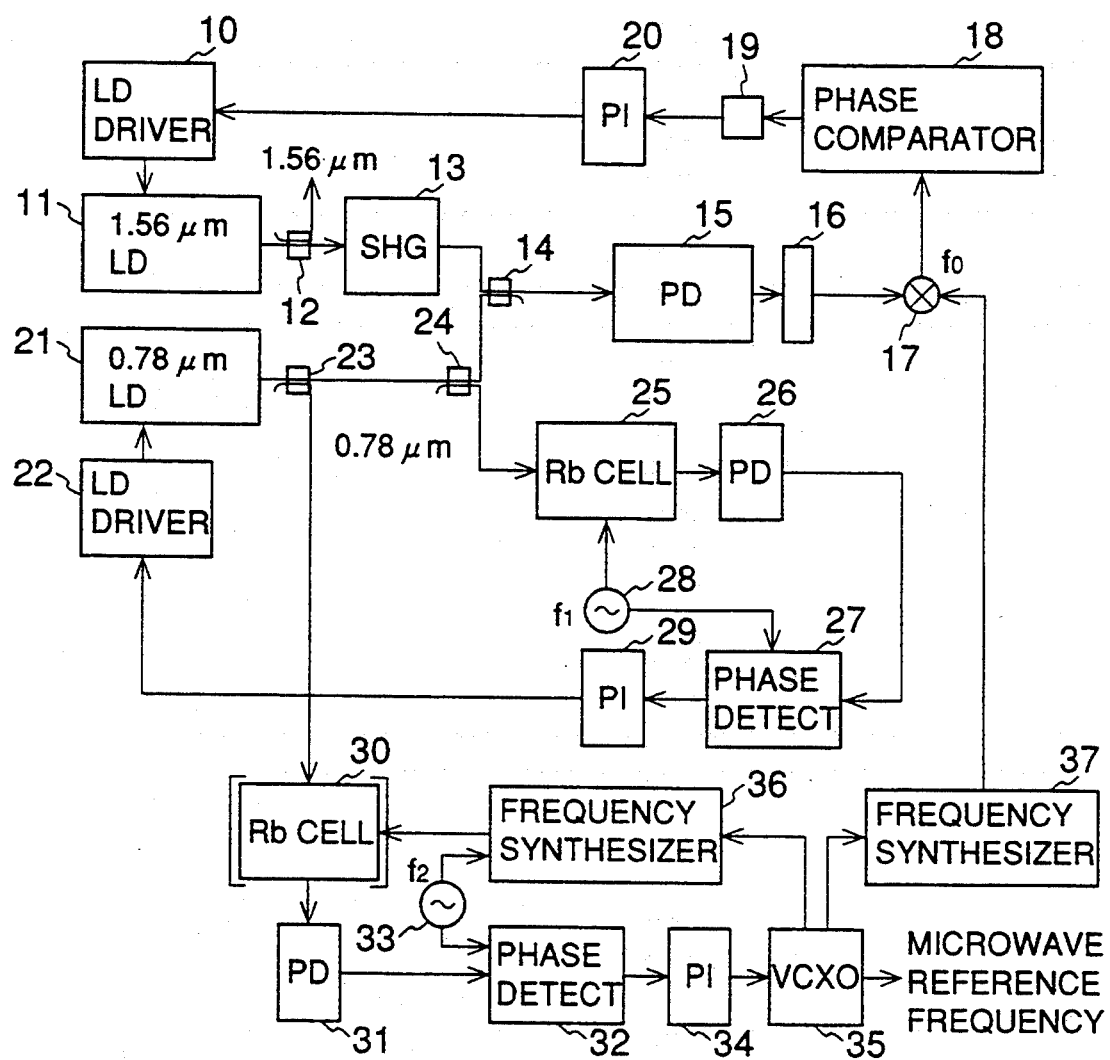
FIG. 4 is a block diagram of a first embodiment of the present invention.

FIG. 4 is a block diagram of a reference light source device according to a first embodiment of the present invention. Parts 10-20 shown in FIG. 4 include the parts 1, 2, 4-6, 8 and 9 shown in FIG. 3, as will be described in detail later. Parts 21-29 shown in FIG. 4 correspond to the frequency generating unit 3, which generates the 0.78 μm light. Parts 30-37 shown in FIG. 4 correspond to the local signal generator 7.

More particularly, a laser driver 11 emits the reference light of a wavelength of 1.56 μm. A waveform splitter splits the received reference light into a light part, used as a 1.56 μm reference light, for light communications, and another part applied to a second-harmonic generator 13. The second harmonic generated by the second-harmonic generator 13 is applied to a waveform combiner 14. The output light of the waveform combiner 14 is applied to a broadband photodetector 15, which converts the received light into an electric signal. A frequency divider 16 divides the frequency of the electric signal output by the photodetector 15. The output signal of the frequency divider 16 is applied to a multiplier 17. The output signal of the multiplier 17 is applied to a phase comparator 18, the output signal of which comparator is applied, via a low-pass filter, to a controller (PI) 20, which performs the PI control. The output signal of the controller 20 is applied to a laser diode driver 10.

A laser diode 21 emits a light having a wavelength of 0.78 μm. A waveform splitter 23 splits the 0.78 μm light into a light part applied to a waveform splitter 24, and another light part applied, as a 0.78 μm reference light, to a microwave cavity resonator 30 having a Rb cell. The light applied to the splitter 24 functions as the local signal. This local signal is split into a light part applied to the waveform combiner 14, and another light part applied to a Rb cell 25. The output signal of the Rb cell 25 is applied to a photodetector 26, which outputs an electric signal to a phase detection unit 27. This phase detection unit 27 also receives a frequency f1 generated by a frequency generator 28. The output signal of the phase detection unit 27 is applied to a controller (PI) 29, which performs the PI control. The output signal of the controller 29 is applied to a laser diode driver 22, which drives the laser diode 21.

The microwave cavity resonator 30 containing the Rb cell receives the 0.78 μm light from the waveform splitter 23, and outputs a transparent light signal to a photodetector 31, as will be described later. An electric signal output by the photodetector 31 is applied to a phase detection unit 32, which also receives a frequency f2 generated by a frequency generator 33. The output signal of the phase detection unit 32 is applied to a controller (PI) 34, which performs the PI control. The output signal of the controller 34 is applied to a voltage-controlled crystal oscillator (VCXO) 35, which generates a microwave reference frequency. A frequency synthesizer 36 receives the output signal of the VCXO 35. A frequency synthesizer 37 generates a local signal of a frequency f0.

A description will now be given of the operations of the parts 21–29, which generates the stabilized frequency corresponding to the waveform 0.78 μm. The light of the wavelength 0.78 μm emitted by the laser diode 21 is applied to the Rb cell 25 via the splitters 23 and 24. The Rb cell 25 is driven by the signal of the frequency f1 generated by the frequency generator 28 and received via a magnetic field coil (not shown) provided for the Rb cell 25. The light absorbing characteristic of the Rb cell 25 is varied according to the frequency f1. The Rb cell 25 absorbs the received light according to the varied light absorbing characteristic. The output light of the Rb cell 25 is applied to the photodetector 26, which outputs the corresponding electric signal to the phase detection unit 27.

The phase detection unit 27 carries out the synchronous detection for the output signal of the photodetector 26 by using the frequency f1 generated by the frequency generator 28. The phase detection unit 27 outputs a difference (error) between the 0.78 μm absorbing frequency and the frequency f1 to the controller 29. Then, the controller 29 controls the driving current generated by the laser diode driver 22 and applied to the laser diode 21 on the basis of the detected error. In the above manner, the laser diode 21 is controlled so that it generates a light signal stably regulated to be at the frequency corresponding to the waveform 0.78 μm. This stable light signal is applied to the waveform combiner 14 via the splitters 23 and 24.

A description will now be given of the operations of the parts 30–37, which stabilize the microwave reference frequency output by the VCXO 35. As shown in FIG. 2, the light absorbing characteristic curve of the Rb atom has two valleys (energy levels of the fine structure) within the 0.78 μm range. The difference between the two energy levels corresponds to 6.83 GHz, which is a frequency within the microwave frequency range.

The light of the waveform 0.78 μm received from the splitter 23 is applied to the resonator 30, which also receives a 6.83 GHz microwave generated by the frequency synthesizer 36, the above microwave being modulated by the frequency f2 generated by the frequency generator 33. At this time, a light/microwave double resonance of the Rb atom occurs. The transparent light signal from the resonator 30 is converted into the corresponding electric signal by the photodetector 31. The phase detection unit 32 carries out the synchronous detection for the electric signal from the photodetector 31 by using the frequency f2. The output signal corresponding to the phase difference (error) between the output signal of the photodetector 31 and the frequency f2 is output by the unit 32, and is applied to the controller 34.

The controller 34 generates a voltage corresponding to the above phase difference, the above voltage being applied to the VCXO 36 as a control signal which controls the oscillation frequency of the VCXO 36. The oscillation frequency of the VXCO 35 is applied to the frequency synthesizer 36, which multiplies the received oscillation frequency by m or 1/m (m is an integer) to thereby generate the frequency 6.8 GHz, which is modulated by the frequency f2 of the frequency generator 33. The output signal of the frequency synthesizer 36 is applied to the microwave cavity resonator 30.

The output signal of the VCXO 35 is also applied to the frequency synthesizer 37, which generates an appropriate frequency based on the stabilized light/microwave resonance frequency. Then, the frequency signal generated by the frequency synthesizer 37 is applied, as the local signal f0, to the multiplier 17. Hence, the stabilized microwave frequency signal functioning as the local signal f0 is generated. By varying the generation frequency (local signal frequency) of the frequency synthesizer 37, it is possible to vary the lock-in frequency of the laser diode 11 at which the laser diode 11 is stably locked.

Next, a description will be given of the overall operation in which the stable reference light can be generated by the 1.56 μm laser diode 11. The reference light emitted by the laser diode 11 is applied, via the splitter 12, to the second-harmonic generator 13, which generates the second harmonic of the reference light. The second harmonic is combined with the light signal emitted by the 0.78 μm laser diode 21 by the combiner 14, and hence the beat signal derived from the two light signals is applied to the photodetector 15. The beat signal light is converted into the electric signal, which is frequency-divided by the frequency divider 16. The frequency-divided signal is then applied to the multiplier 17. It is also possible to directly apply the output signal of the photodetector 15 to the multiplier 17.

The multiplier 17 multiplies the received beat signal from the photodetector 15 (or the frequency divider 16) by the microwave local signal generated by the frequency synthesizer 37, and outputs the multiplication result to the phase comparator 18. This phase comparator 18 generates the output signal (level signal) corresponding to the phase difference between the beat signal and the local signal. The output signal of the phase comparator 18 passes through the low-pass filter 19, and is applied, as an error signal, to the controller 20. This controller 20 controls the driving current output by the laser diode driver 10 on the basis of the phase difference indicated by the error signal.

In the above manner, the light heterodyne beat signal of the second harmonic of the 1.56 μm light and the stabilized 0.78 μm light is detected in order to improve the sensitivity of detection of the 0.78 μm light, and the laser diode 11 is controlled so that the frequency of the beat signal becomes equal to the frequency f0 of the microwave local signal generated by the synthesizer 37 and calibrated by the microwave reference frequency generated by the VCXO 35. Hence, the stable and non-modulated 1.56 μm reference light can be obtained.

Figure 5:
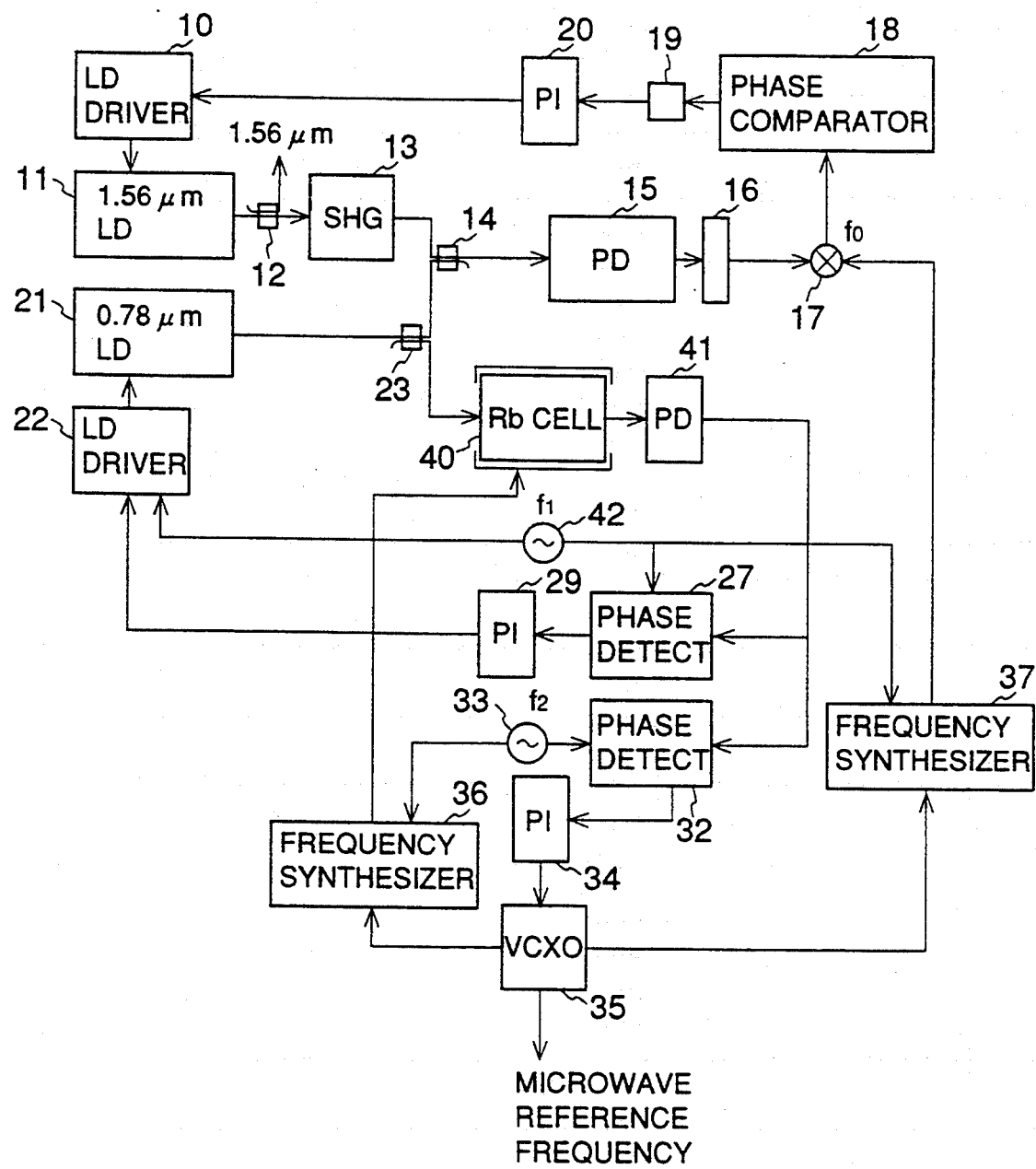
FIG. 5 is a block diagram of a second embodiment of the present invention.

A description will now be given, with reference to FIG. 5, of a second embodiment of the present invention. In FIG. 5, parts that are the same as parts shown in the previously described figures are given the same reference numbers as previously. The second embodiment of the present invention differs from the first embodiment thereof in that a part of the structure for stabilizing the 0.78 μm laser diode 21 is used in common to a part of the structure for stabilizing the microwave reference frequency to make the overall circuit configuration compact and reduce the production cost.

More particularly, a microwave cavity resonator 40 and a photodetector 41 are commonly used to stabilize the 0.78 μm laser diode 21 and the microwave reference frequency. A frequency generator 42 generates the frequency f2, which is applied, as the modulation signal, to the laser diode driver 22, and is also applied to the phase detection unit 27, which carries out the synchronous detection for the output signal of the photodetector 41 by using the frequency f1. The error signal detected by the phase detection unit 27 is applied to the controller 29, which drives the laser diode driver 22.

The frequency f2 is applied to the frequency synthesizer 36, which modulates the microwave reference signal from the VXCO 35 by using the frequency f2. Further, the frequency f2 is applied to the phase detection unit 32, which detects the phase difference between the output signal of the photodetector 31 and the frequency f2. The output signal of the phase detection unit 32 is applied to the controller 34, which outputs the control voltage to the VXCO 35. The frequency synthesizers 36 and 37 receives the microwave reference signal generated by the VCXO 35. The frequency synthesizer 36 generates the 6.83 GHz microwave. The output signal of the frequency synthesizer 37 has been modulated by the frequency f1, and is used as the local signal for stabilizing the 1.56 μm laser diode 11.

The present invention is not limited to the specifically disclosed embodiments, and variations and modifications may be made without departing from the scope of the present invention. For example, it is possible to use lithium niobate instead of Rb.

What is claimed is:

1. A reference light source device comprising:
    a first laser diode emitting a reference light;
    harmonic generating means for generating an nth harmonic of the reference light where n is an integer;
    light generating means for generating a light signal having a waveform equal to that of said nth harmonic of the reference light;
    photodetector means for combining the nth harmonic and said light signal and for generating a first electric signal corresponding to a beat signal obtained by combining the nth harmonic and the light signal;
    local signal generating means for generating a local signal;
    phase comparator means for generating a control signal corresponding to a phase difference between the first electric signal and the local signal; and
    driving means for driving the first laser diode according to the control signal so that a frequency of the beat signal is equal to that of the local signal.

2. The reference light source device as claimed in claim 1, wherein said phase comparator means comprises:
    frequency divider means for dividing the frequency of the first electric signal to thereby output a frequency-divided signal;
    multiplier means for multiplying the frequency-divided signal by the local signal to thereby output a multiplication result signal; and
    means for generating the control signal from the multiplication result signal.

3. The reference light source device as claimed in claim 1, wherein said light generating means comprises:
    a second laser diode emitting said light signal;
    cell means for absorbing a light component of a predetermined frequency contained in said light signal;
    a photodetector for converting an output light signal from said cell means into a second electric signal;
    a phase detection unit for detecting a phase difference between the second electric signal and a reference frequency signal; and
    a controller for controlling the second laser diode on the basis of the phase difference detected by the phase detection unit.

4. The reference light source device as claimed in claim 1, wherein said local signal generating means comprises:
    a second laser diode emitting said light signal;
    a microwave resonator for outputting a resonance light signal of said light signal based on a modulated microwave signal;
    a photodetector for converting said resonance light signal from said microwave resonator into a second electric signal;
    a phase detection unit for detecting a phase difference between the second electric signal and a reference frequency signal;
    a voltage-controlled oscillator for generating a microwave reference signal on the basis of the phase difference detected by the phase detection unit; and
    a first frequency synthesizer for generating said local signal from the microwave reference signal.

5. The reference light source device as claimed in claim 4, wherein said local signal generating means comprises a second frequency synthesizer for generating said modulated microwave signal from the microwave reference signal and said reference frequency signal and for applying the modulated microwave signal to the microwave resonator.

6. The reference light source device as claimed in claim 1, wherein said light generating means comprises:
    a second laser diode emitting said light signal;
    cell means for absorbing a light component of a predetermined frequency contained in said light signal;
    a first photodetector for converting an output light signal from said cell means into a second electric signal;
    a first phase detection unit for detecting a phase difference between the second electric signal and a first reference frequency signal; and
    a controller for controlling the second laser diode on the basis of the phase difference detected by the phase detection unit, and
    wherein said local signal generating means comprises:
    a microwave resonator for outputting a resonance light signal of said light signal based on a modulated microwave signal;
    a second photodetector for converting said resonance light signal from said microwave resonator into a third electric signal;
    a second phase detection unit for detecting a phase difference between the third electric signal and a second reference frequency signal;
    a voltage-controlled oscillator for generating a microwave reference signal on the basis of the phase difference detected by the second phase detection unit; and
    a first frequency synthesizer for generating said local signal from the microwave reference signal.

7. The reference light source device as claimed in claim 6, wherein said local signal generating means comprises a second frequency synthesizer for generating said modulated microwave signal from the microwave reference signal and said reference frequency signal and for applying the modulated microwave signal to the microwave resonator.

8. The reference light source device as claimed in claim 1, wherein said light generating means comprises:
a second laser diode emitting said light signal;
a microwave resonator for outputting a resonance light signal of said light signal based on a modulated microwave signal;
a first photodetector for converting the resonance light signal from said microwave resonator into a second electric signal;
a first phase detection unit for detecting a phase difference between the second electric signal and a first reference frequency signal; and
a controller for controlling the second laser diode on the basis of the phase difference detected by the phase detection unit and the first reference frequency signal, and
wherein said local signal generating means comprises:
a second photodetector for converting said resonance light signal from said microwave resonator into a third electric signal;
a second phase detection unit for detecting a phase difference between the third electric signal and a second reference frequency signal;
a voltage-controlled oscillator for generating a microwave reference signal on the basis of the phase difference detected by the second phase detection unit; and
a first frequency synthesizer for generating said local signal from the microwave reference signal and the first reference frequency signal.

9. The reference light source device as claimed in claim 8, wherein said local signal generating means comprises a second frequency synthesizer for generating said modulated microwave signal from the microwave reference signal and said reference frequency signal and for applying the modulated microwave signal to the microwave resonator.

10. The reference light source device as claimed in claim 1, wherein:
said first laser diode emits the reference light within a 0.5 μm wavelength range; and
said light generating means generates a light signal of a wavelength of 0.78 μm.

11. The reference light source device as claimed in claim 3, wherein said cell means comprises a Rb cell.

12. The reference light source device as claimed in claim 4, wherein said microwave resonator comprises a Rb cell.

13. The reference light source device as claimed in claim 3, wherein:
said first laser diode comprises a 1.56 μm laser diode; and
said second laser diode comprises a 0.78 μm laser diode.

* * * * *